(12) United States Patent
Frohberg et al.

(10) Patent No.: US 7,550,396 B2
(45) Date of Patent: Jun. 23, 2009

(54) METHOD FOR REDUCING RESIST POISONING DURING PATTERNING OF SILICON NITRIDE LAYERS IN A SEMICONDUCTOR DEVICE

(75) Inventors: Kai Frohberg, Niederau (DE); Volker Grimm, Langebrueck (DE); Sven Mueller, Wiednitz (DE); Matthias Lehr, Dresden (DE); Ralf Richter, Dresden (DE); Jochen Klais, Radebeul (DE); Martin Mazur, Dresden (DE); Heike Salz, Radebeul (DE); Joerg Hohage, Dresden (DE); Matthias Schaller, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 97 days.

(21) Appl. No.: 11/742,878

(22) Filed: May 1, 2007

(65) Prior Publication Data
US 2008/0081480 A1   Apr. 3, 2008

(30) Foreign Application Priority Data
Sep. 29, 2006  (DE) ............. 10 2006 046 374

(51) Int. Cl.
*H01L 21/461* (2006.01)

(52) U.S. Cl. .......... 438/757; 438/231; 438/682; 257/E21.249; 257/E21.438

(58) Field of Classification Search ........... 438/757, 438/703, 199, 231, 682, 740, 792; 257/E21.249, 257/E21.257, E21.438, E29.266, E21.051
See application file for complete search history.

(56) References Cited

U.S. PATENT DOCUMENTS

| 6,620,560 | B2 | 9/2003 | Jiang et al. ............. 430/5 |
| 2004/0062867 | A1* | 4/2004 | Friedmann et al. ...... 427/258 |
| 2005/0269650 | A1 | 12/2005 | Pidin ............... 257/411 |
| 2007/0249113 | A1* | 10/2007 | Grudowski et al. ...... 438/199 |
| 2007/0287240 | A1* | 12/2007 | Chen et al. ............ 438/197 |

OTHER PUBLICATIONS

Translation of Official Communication from German Patent Office for German Patent Application No. 10 2006 046 374.9-33 dated Jul. 24, 2007.

* cited by examiner

*Primary Examiner*—Caridad M Everhart
(74) *Attorney, Agent, or Firm*—Williams, Morgan & Amerson, P.C.

(57) ABSTRACT

By performing a plasma treatment for efficiently sealing the surface of a stressed dielectric layer containing silicon nitride, an enhanced performance during the patterning of contact openings may be achieved, since nitrogen-induced resist poisoning may be significantly reduced during the selective patterning of stressed layers of different types of intrinsic stress.

22 Claims, 7 Drawing Sheets

METHOD FOR REDUCING RESIST POISONING DURING PATTERNING OF SILICON NITRIDE LAYERS IN A SEMICONDUCTOR DEVICE

BACKGROUND OF THE INVENTION

1. Field of the Invention

Generally, the present disclosure relates to the field of integrated circuits, and, more particularly, to the manufacture of field effect transistors on the basis of nitrogen-containing dielectric layers, such as stressed contact etch stop layers used for generating strain in channel regions of the transistors.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability.

A further issue associated with reduced gate lengths is the occurrence of so-called short channel effects, which may result in a reduced controllability of the channel conductivity. Short channel effects may be countered by appropriately scaling the capacitive coupling of the gate electrode to the channel region, for instance by reducing the thickness of the gate insulation layer, providing enhanced dopant profiles in the channel region and in adjacent drain and source areas and the like. However, some of these design measures, such as increasing the dopant concentration in the channel region or the provision of high-k dielectrics in the gate insulation layer, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, while the reduced channel length may even require enhanced dopant concentrations in order to control short channel effects, thereby making a reduction of the dopant concentration a less attractive approach unless other mechanisms are developed to adjust a desired threshold voltage. Second, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase of the conductivity of N-type transistors. On the other hand, compressive strain in the channel region may increase the mobility of holes, thereby providing the potential for enhancing the performance of P-type transistors.

One promising approach in this respect is a technique that enables the creation of desired stress conditions within the channel region of different transistor elements by adjusting the stress characteristics of a contact etch stop layer that is formed above the basic transistor structure in order to form contact openings to the gate and drain and source terminals in an interlayer dielectric material. The effective control of mechanical stress in the channel region, i.e., effective stress engineering, may be accomplished by individually adjusting the internal stress in the contact etch stop layer of the respective transistor in order to position a contact etch contact layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition processes (PECVD) above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher for compressive stress and up to 1 GPa and significantly higher for tensile stress, wherein the type and the magnitude of the intrinsic stress may be efficiently adjusted by selecting appropriate deposition parameters. For example, ion bombardment, deposition pressure, substrate temperature, gas components and the like represent respective parameters that may be used for obtaining the desired intrinsic stress.

In a typical process sequence, a contact etch stop layer having compressive stress is formed above the transistors after completing the formation of respective metal silicide regions. In order to protect the silicide regions during the further patterning process, a stop layer formed of silicon dioxide may be provided prior to depositing the compressive etch stop layer. Then, a thin etch indicator layer comprised of silicon dioxide is formed on the silicon nitride layer, for controlling an etch process to selectively remove the tensile silicon nitride layer from the compressive silicon nitride above the P-channel transistor. Thereafter, the stressed etch stop layer may be removed from the N-channel transistor by providing a resist mask and etching the exposed portion of the etch stop layer, using the silicon dioxide stop layer as an etch stop. Next, the tensile silicon nitride layer is deposited, which is subsequently removed from the P-channel transistor on the basis of a corresponding resist mask and the etch indicator layer.

In other approaches, the process sequence for applying and selectively removing the silicon nitride etch stop layers may be reversed, i.e., the tensile silicon nitride may be formed first. In these manufacturing regimes, however, a significant defect rate and contact failures may be observed.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for enhancing the performance of photolithography processes, which may be performed on the basis of a silicon nitride containing material, such as stressed layers formed above transistor devices so as to induce a respective strain therein, or for silicon nitride based anti-reflective coating (ARC) materials. It has been recognized that a significant loss of production yield may be observed during forming contact openings into device areas, such as contact areas of transistor devices, in particular when stressed etch stop layers of different types of intrinsic stress may be used, which are patterned on the basis of a corresponding lithography process in order to provide the desired type of strain in the respective transistor elements. The respective nitrogen contamination of the sensitive resist material may therefore lead to corresponding unwanted nitride residuals, which may negatively affect the corresponding patterning process for forming respective contact openings. In order to significantly enhance the overall process efficiency, an additional surface treatment may be performed prior to applying a corresponding resist material to significantly reduce nitrogen diffusion into the resist material. For this purpose, a plasma treatment on the basis of an oxidizing ambient may be performed in some illustrative embodiments, which may densify and substantially seal the corresponding surface prior to applying the resist material.

According to one illustrative embodiment disclosed herein, a method comprises forming a first stress-inducing layer above a first transistor and a second transistor and performing a plasma treatment on the first stress-inducing layer for densifying a surface thereof. Furthermore, a first resist mask is formed above the first stress-inducing layer having the densified surface, thereby covering the first transistor. Additionally, an exposed portion of the first stress-inducing layer is removed from the second transistor.

According to another illustrative embodiment disclosed herein, a method comprises forming a silicon nitride containing material layer above a device area of a semiconductor device. Furthermore, a plasma treatment in an oxidizing ambient is performed in order to modify a surface of the silicon nitride containing material layer. Thereafter, a resist mask is formed above the plasma treated silicon nitride containing material layer and an etch process is performed on the basis of the resist mask.

According to yet another illustrative embodiment disclosed herein, a method comprises forming a first stress-inducing layer having a first type of intrinsic stress above a first device region and a second device region. Then, a first resist mask is formed above the first stress-inducing layer to expose the second device region and cover the first device region. The method further comprises selectively removing the first stress-inducing layer from the second device region and forming a second stress-inducing layer having a second type of intrinsic stress above the first and the second regions. Furthermore, a second resist mask is formed above the second stress-inducing layer, wherein the second resist mask exposes the first device region and covers the second device region. Moreover, at least one plasma treatment is performed at least prior to forming the second resist mask.

BRIEF DESCRIPTION OF THE DRAWINGS

The disclosure may be understood by reference to the following description taken in conjunction with the accompanying drawings, in which like reference numerals identify like elements, and in which.

Figure 1A:
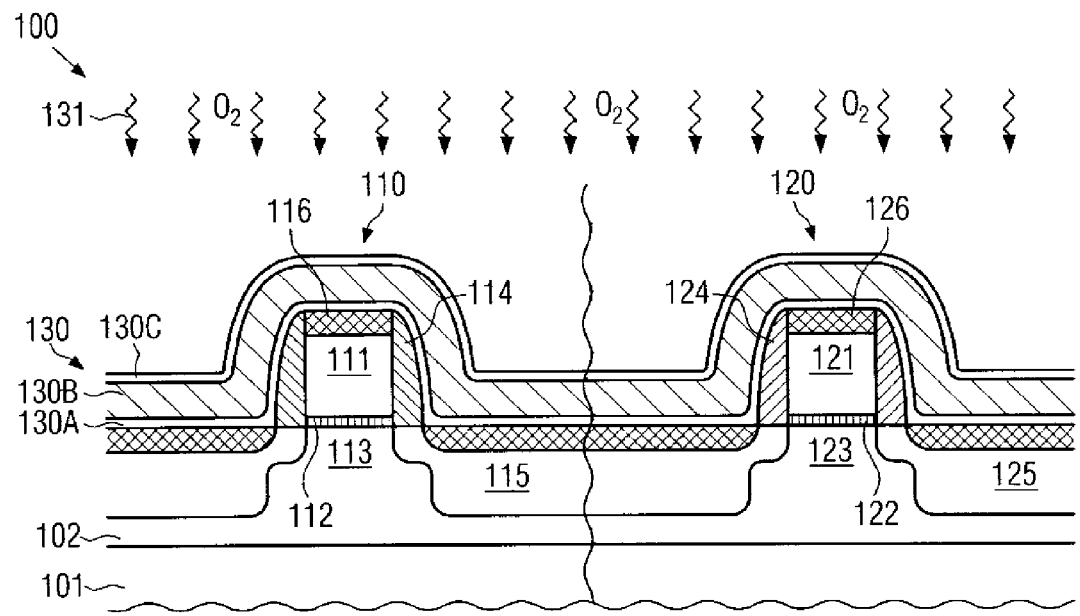
FIGS. 1a-1d schematically illustrate cross-sectional views of a semiconductor device during various manufacturing stages in providing differently stressed contact etch stop layers above respective transistor elements on the basis of a significantly reduced nitrogen contamination according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for enhancing the surface characteristics of stressed dielectric layers used for creating a respective strain in transistor elements and/or in nitrogen-containing ARC layers in order to reduce the contamination of sensitive resist materials with nitrogen and nitrogen radicals. Without intending to restrict the present invention to the following explanation, it is believed that one cause for the high defect rate during the process for forming contact openings in an interlayer dielectric material on the basis of differently stressed contact etch stop layers may reside in the lithography process for providing the differently stressed silicon nitride containing material above respective transistor elements. During the lithography process for selectively removing, for instance, compressive silicon nitride material from the N-channel transistor, a high probability may exist that the resist layer formed above the silicon nitride layer may be contaminated by nitrogen and nitrogen radicals stemming from the underlying silicon nitride material. In particular, for the compressive silicon nitride layer, high nitrogen contents may be used for obtaining the desired high compressive stress. The corresponding interaction of the nitrogen with the photo active components of the resist may block the photo acidic generator effect of the photoresist material, which usually reacts upon exposure so as to produce acid in order to catalyze a chemical reaction for locally changing the solubility of the resist material. This material may then be removed during the development process in order to provide the desired pattern. Thus, upon interaction with nitrogen, the photo acidic reaction may be partially blocked which may also be referred to as resist poisoning, thereby resulting in non-removed resist portions after developing the exposed resist material. Consequently, these non-removed resist portions may also affect the subsequent etch process for removing the silicon nitride material, thereby resulting in corresponding nitride residuals. These residuals, on the other hand, may not only negatively affect the stress engineering above the corresponding transistor that actually requires a different type of stressed silicon nitride material, but may also influence the subsequent contact etch process. That is, after depositing a further stressed silicon nitride material above the N-channel transistor and removing the unwanted portion thereof above the P-channel transistor, an increased thickness of the silicon nitride material may be obtained above the P-channel transistor due to the non-removed silicon nitride portions resulting form the resist poisoning effect. If areas of increased thickness may be located at positions at which respective contact openings have to be formed, the corresponding etch process may not reliably etch through the silicon nitride material having the increased thickness, thereby resulting in faulty contact plugs, which may even result in a loss of the entire circuit. As previously explained, even if a corresponding etch indicator layer, typically comprised of silicon dioxide, may be formed above the stressed silicon nitride containing material, a significant yield loss may be observed, wherein it has been recognized that the corresponding silicon dioxide material may not sufficiently reduce the nitrogen diffusion into the overlying resist material. Consequently, an enhanced mechanism is provided in order to more efficiently seal the corresponding surface of a respective nitrogen-containing layer, such as a stressed interlayer dielectric material, other nitrogen-containing material layers typically used as ARC materials and the like, which may be accomplished on the basis of a plasma treatment prior to the application of the corresponding resist material. Consequently, an unwanted portion of the silicon nitride material may be removed with increased reliability, thereby providing enhanced performance during a subsequent etch process and also increasing the stress transfer mechanism, if highly stressed silicon nitride materials are considered.

FIG. 1a schematically illustrates a cross-sectional view of a semiconductor device 100 during an advanced manufacturing stage. The semiconductor device 100 as shown may comprise a substrate 101, which may represent any appropriate carrier material for forming thereabove a semiconductor layer 102 that is appropriate for forming therein and thereon respective circuit elements, such as transistors, capacitors, resistors and the like. The substrate 101 may, for instance, represent a bulk silicon substrate having formed thereon the layer 102 with an appropriate material composition and crystalline orientation, as prescribed by device requirements. In other cases, the substrate 101 may, in combination with the semiconductor layer 102, represent a silicon-on-insulator (SOI) configuration, in which a corresponding buried insulating layer (not shown) may electrically insulate the layer 102 from the substrate 101. Furthermore, the semiconductor device 100 may comprise a first device region 110 and a second device region 120, which may be represented in the embodiment shown by respective transistor elements, which, for convenience, may also be indicated as a first transistor 110 and a second transistor 120, wherein it should be borne in mind that the corresponding first and second device regions 110, 120 may comprise more than one transistor elements, depending on device requirements. For instance, a different type or magnitude of strain may be required in the different device regions 110, 120 due to different requirements during operation of the device 100, for instance, with respect to sensitive device areas, such as static RAM cells, compared to speed critical logic blocks and the like. In still other illustrative embodiments, the first and the second device regions 110, 120 may be represented by respective transistors of different conductivity type, wherein a different type of stress may be applied so as to obtain a predefined type of strain in the corresponding device regions 110, 120.

In the manufacturing stage as illustrated in FIG. 1a, the first and second transistors 110, 120 may comprise respective gate electrodes 111, 121 formed above corresponding channel regions 113, 123 and separated therefrom by respective gate insulation layers 112, 122, respectively. Furthermore, sidewall spacers 114, 124 may be formed on the respective gate electrodes 111, 121, and drain and source regions 115, 125 may be formed in the semiconductor layer 102. Furthermore, respective metal silicide regions 116, 126 may be provided, depending on the device requirements. It should be appreciated that the corresponding components of the first and second transistors 110, 120 may differ in size, material composition and the like, depending on the specifics of the respective transistor elements 110, 120. For example, the transistors 110, 120 may represent transistors of different conductivity type such as an N-channel transistor and a P-channel transistor, respectively, which may have similar design dimensions or which may have different dimensions, depending on the corresponding function within the device 100. Similarly, the first and second transistors 110, 120 may be provided at different device areas, while, in other cases, the transistors 110, 120 may represent closely spaced circuit elements, such as adjacent transistor elements of a complementary transistor pair. In this case, an appropriate isolation structure (not shown) may be provided between the first and the second transistors 110, 120.

As previously explained, the performance of respective transistor elements may be increased by appropriately modifying the lattice structure in the low doped channel regions 113, 123, which may be accomplished on the basis of a highly stressed dielectric material, which may, in one illustrative embodiment, be provided in the form of a nitrogen-containing material layer 130. In some illustrative embodiments, the stressed layer 130 may be comprised of silicon nitride having a desired intrinsic stress, such as compressive or tensile stress, as may be required for enhancing the transistor performance of one of the transistors 110, 120. For example, in some approaches, the stressed layer 130 may comprise a high compressive stress, which may be appropriate for enhancing the performance of P-channel transistors, while, in other illustrative embodiments, the process sequence may be started with the stressed layer 130 having a high tensile stress. It should be appreciated that the stressed layer 130 may, in some illustrative embodiments, comprise one or more sub-layers, depending on the further process requirements. In one illustrative embodiment, as shown in FIG. 1a, the stressed layer 130 may comprise an etch stop layer 130A, which may be comprised of an appropriate material having a high etch selectivity with respect to a corresponding layer 130B providing the actual high intrinsic stress. Thus, sub-layer 130B may be comprised of silicon nitride, while the etch stop layer 130A may be comprised of silicon dioxide providing the required stop capabilities during a subsequent etch process for selectively removing a portion of the stressed layer 130. In other illustrative embodiments, the stressed sub-layer 130B may be substantially directly formed on the corresponding transistors 110, 120, when etch damage caused in the subsequent patterning process may be considered as tolerable. In one illustrative embodiment, as shown in FIG. 1a, the stressed layer 130 may comprise a surface layer 130C that may provide a low diffusion rate of nitrogen atoms and radicals, stemming from the layer 130B. For instance, the layer 130C may comprise silicon, nitrogen and oxygen, which may form a highly dense surface configuration, thereby reducing an out-diffusion of nitrogen from the layer 130C and also efficiently hindering a nitrogen migration from the layer 130B through the layer 130C.

A typical process flow for forming the semiconductor device 100 as shown in FIG. 1a may comprise the following processes. After providing the substrate 101 having formed thereon the semiconductor layer 102, well-established process sequences may be performed in order to provide respective circuit elements, such as the first and second transistors 110, 120, or any other respective circuit elements as required. For example, in some illustrative embodiments, the respective transistor elements 110, 120 may represent field effect transistors having a gate length, i.e. in FIG. 1a, the corresponding horizontal dimension of the respective gate electrodes 111, 121, of approximately 100 nm and significantly less, such as 50 nm and less. Consequently, highly sophisticated manufacturing processes, including photolithography, etch and deposition techniques, implantation processes and the like, may be used. In particular, in highly sophisticated photolithography techniques, respective resist materials may be used, which may exhibit an increased sensitivity to nitrogen contamination as is previously explained. After completing the transistors 110, 120 on the basis of well-established techniques, the stress-inducing layer 130 may be formed, for instance by depositing the etch stop layer 130A, if required, followed by a corresponding PECVD process for depositing silicon nitride material on the deposition surface, e.g., the etch stop layer 130A, with a high degree of intrinsic stress. For example, the layer 130B having a high compressive or tensile stress may be deposited on the basis of predefined process parameter values so as to obtain the desired degree and magnitude of intrinsic stress. For example, respective parameters, such as deposition pressure, the flow rates of the corresponding gases, the substrate temperature and, in particular, the degree of ion bombardment during the deposition, may be used for obtaining the desired intrinsic stress. Typically, when providing a high compressive stress, a significant amount of nitrogen may have to be incorporated into the layer 130B, which may therefore exhibit an increased tendency for a nitrogen diffusion in subsequent processes. Thus, in one illustrative embodiment, after the deposition of the layer 130B, a plasma treatment 131 may be performed on the basis of an oxidizing ambient, which may comprise oxygen or ozone, where the oxidizing gas component may, in combination with the particle bombardment created during the plasma ambient, result in an oxidized portion of the silicon nitride layer 130B, thereby forming the surface layer 130C having the required high resistivity against nitrogen diffusion. Appropriate process parameters for establishing the plasma ambient of the process 131 may be readily established on the basis of available process tools that are able to create the respective oxidizing plasma ambient. For example, deposition tools designed for a PECVD process may be readily used, wherein corresponding parameter values for bias power, high frequency power and oxygen or ozone concentration, in combination with an appropriate ambient pressure and substrate temperature, may be readily established. For example, a plasma ambient as usually used for resist stripping processes may be applied in order to form a respective silicon dioxide material within the surface layer 130C having a high density in order to seal the underlying silicon nitride material for substantially avoiding a nitrogen diffusion during subsequent process steps. Due to the high efficiency in forming a highly dense silicon dioxide material, the surface layer 130C may be provided with a thickness of as little as only several nanometers up to 10 or more nanometers depending on the process requirements.

Figure 1B:
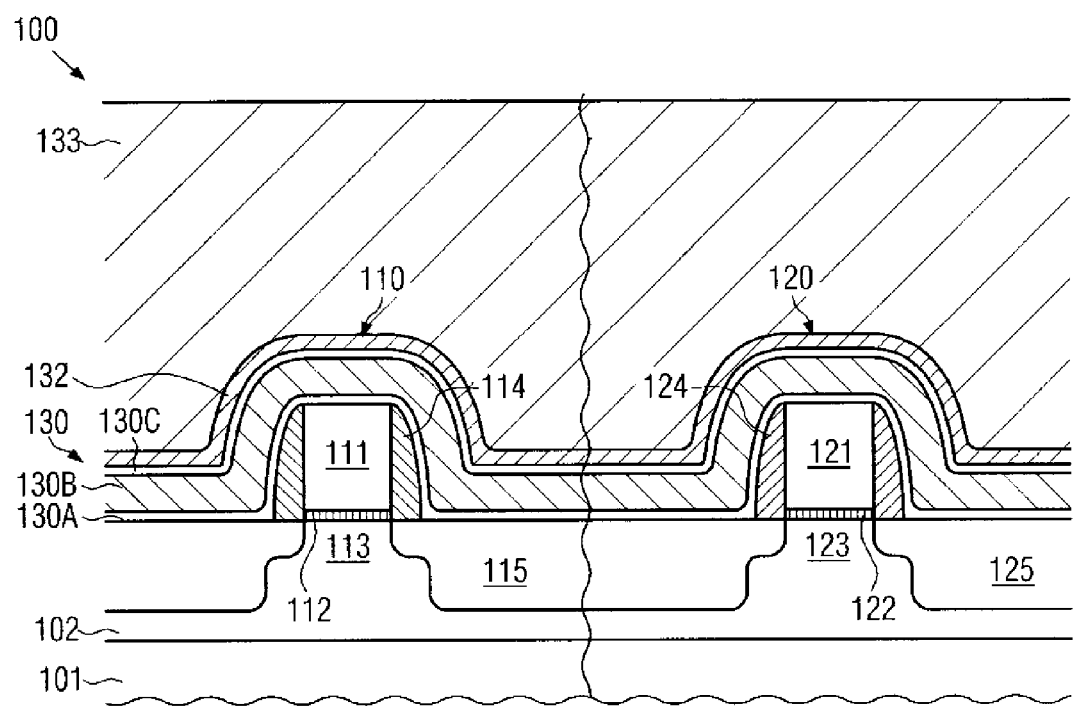

FIG. 1*b* schematically illustrates the semiconductor device 100 in a further advanced manufacturing stage. Here, an etch indicator layer 132 may be formed on the stress-inducing layer 130, wherein the etch indicator layer 132 may be comprised of any appropriate material in order to provide a reliable endpoint detection signal during an etch process performed in a later stage in order to remove an unwanted portion of stressed silicon nitride material from the first transistor 110. Thus, the etch indicator layer 132 may have a different composition compared to silicon nitride and may, in some illustrative embodiments, be comprised of silicon dioxide, wherein a corresponding density thereof may be less critical since an efficient confinement of nitrogen may be accomplished on the basis of the surface layer 130C. In still other illustrative embodiments, the etch indicator layer 132 may be omitted and the corresponding surface layer 130C may be used as an etch indicator layer or etch stop layer, wherein a corresponding thickness thereof may be appropriately adapted to obtain the desired control function during the subsequent patterning process. Furthermore, the semiconductor device 100 may comprise a resist layer 133, which is, due to the surface layer 130C, efficiently separated from nitrogen material contained at least in the layer 130B.

The etch indicator layer 132, if provided, may be formed on the basis of a chemical vapor deposition (CVD) process using silane as a precursor gas, wherein a thickness of the layer 132 may range from several nanometers to 15 nm or more. The resist layer 133 may be formed in accordance with well-established spin on techniques and pre-exposure treatments. In some illustrative embodiments, if the pronounced surface topography created by the first and second transistor 110, 120 may be considered inappropriate for performing a subsequent lithography process on the basis of the resist layer 133, a corresponding planarization process may be performed prior to the deposition of the resist layer 133, for instance by providing an appropriate planarization material (not shown), which may additionally be planarized on the basis of chemical mechanical polishing (CMP) and the like, if required, in order to provide a substantially uniform thickness of the resist layer 133. In still other illustrative embodiments, the stress-inducing layer 130 may be provided with a high thickness, and a corresponding planarization process, such as CMP, may be performed prior to performing the plasma treatment 131, thereby also providing an enhanced surface topography and/or an improved stress transfer mechanism. After forming the resist layer 133, a corresponding lithography process may be performed, wherein, due to the reduced nitrogen contamination, respective exposed portions of the resist layer 133 may be efficiently removed to form a corresponding resist mask having a reduced degree of resist residuals, which may, in conventional strategies, significantly affect the further processing, as is previously explained.

Figure 1C:
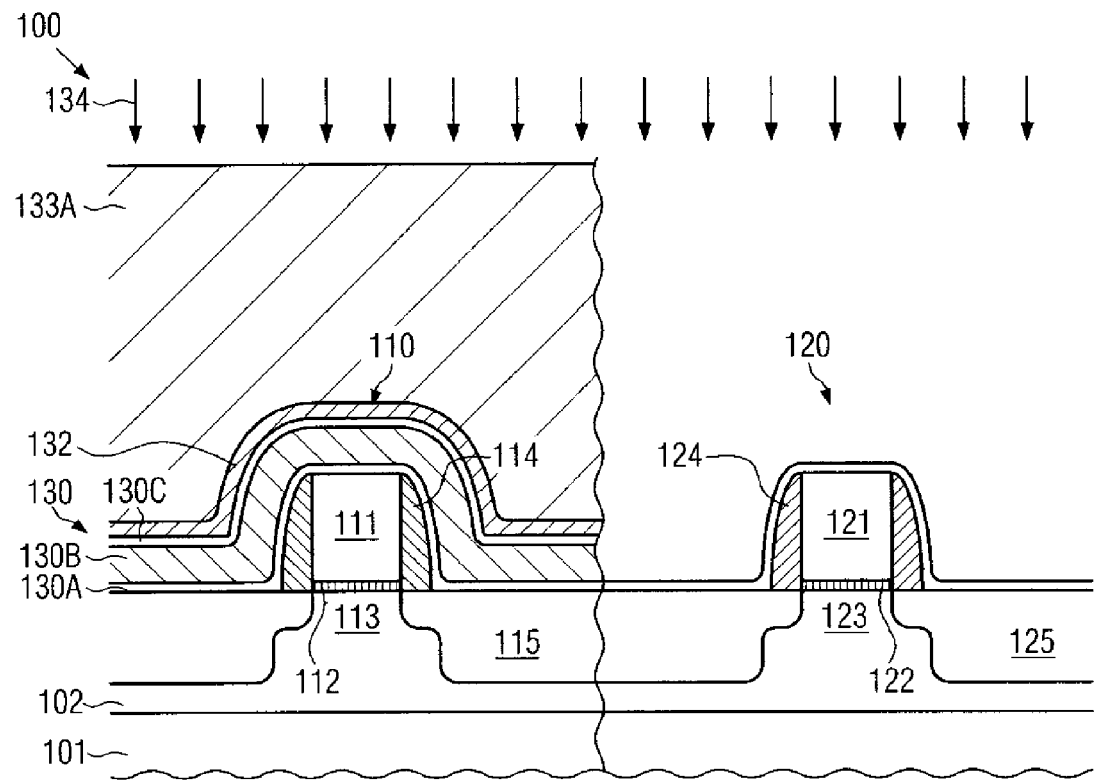

FIG. 1*c* schematically illustrates the semiconductor device 100 in a further advanced manufacturing stage. In this phase, a resist mask 133A, formed from the resist layer 133, may be used during an etch process 134 for removing material of an exposed portion of the stress-inducing layer 130. For this purpose, the etch process 134 may be designed so as to etch through the layer 132, if provided, and the surface layer 130C and subsequently an appropriate selective etch chemistry may be used for efficiently removing the silicon nitride material of the layer 130B, wherein the corresponding etch front may be reliably stopped on the etch stop layer 130A, if provided, while, in other cases, respective recipes having a high degree of selectivity with respect to the metal silicide material provided in the regions 126 may be used. The removal of the silicon nitride material of the layer 130B may be performed with high efficiency due to the enhanced nitrogen diffusion blocking effect achieved by the surface layer 130C, thereby significantly reducing any resist residuals of the second transistor 120. Next, the resist mask 133A may be removed, for instance on the basis of oxygen plasma, as is well established in the art.

Figure 1D:
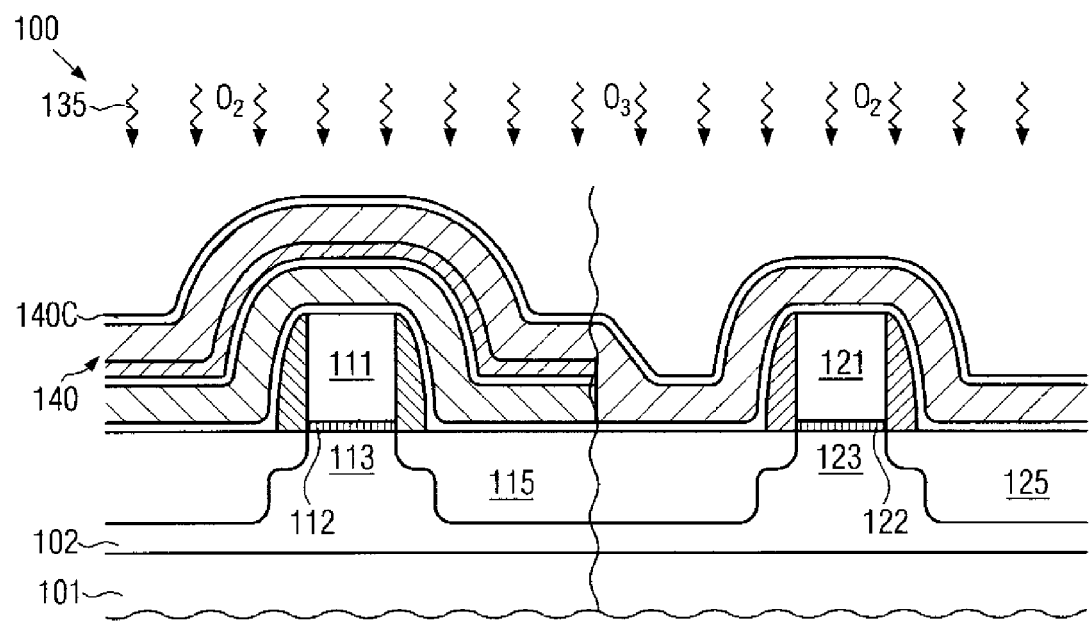
Figure 1E:
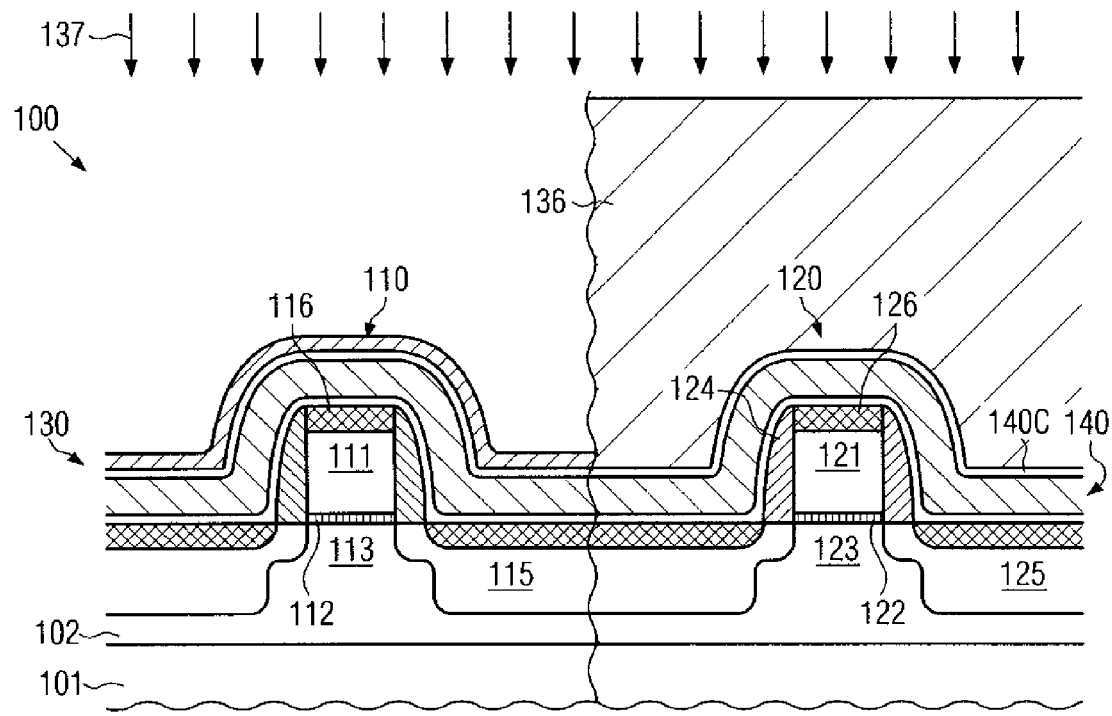
FIG. 1e schematically illustrates a cross-sectional view of the semiconductor device according to a further illustrative embodiment for sealing the surface of a stress-inducing layer having formed thereon a thin etch indicator layer.

FIG. 1*d* schematically illustrates the semiconductor device 100 in a further advanced manufacturing stage. A second stress-inducing layer 140 may be formed above the first and second transistors 110, 120, wherein the second stress-inducing layer 140 may comprise a silicon nitride material having a different type of intrinsic stress compared to the first stress-inducing layer 130. For example, if the first layer 130 may comprise silicon nitride of high compressive stress, the layer 140 may comprise a high tensile stress, while, in other process strategies, the layer 130 may be provided with a high tensile stress, if the transistor 110 may require a corresponding strain generated on the basis of a tensile stress in the layer 130, while the layer 140 may be provided with high compressive stress, when the second transistor 120 may exhibit enhanced performance when provided with the compressive stress of the layer 140. The second stress-inducing layer 140 may be formed on the basis of well-established deposition techniques as previously described with respect to the layer 130. In one illustrative embodiment as shown in FIG. 1*e*, the second stress-inducing layer 140 may be subjected to a further plasma treatment on the basis of an oxidizing ambient established by oxygen or ozone or a mixture thereof, as is previously explained. Thus, during the plasma treatment 135, a corresponding surface layer 140C may be created above the silicon nitride containing material, thereby providing the enhanced diffusion blocking characteristics as are also previously described with respect to the layer 130. Thereafter, a further resist layer may be formed, wherein the additional surface layer 140C may significantly reduce nitrogen diffusion, thereby also significantly reducing any resist poisoning effect that may be caused by the second stress-inducing layer 140.

FIG. 1*e* schematically illustrates the semiconductor device 100 in a further advanced manufacturing stage, wherein a corresponding resist mask 136 may be formed so as to cover the second transistor 120 while exposing the first transistor 110. Thus, due to the enhanced nitrogen diffusion blocking effect of the surface layer 140C, corresponding resist residuals above the first transistor 110 may be significantly suppressed, compared to conventional strategies. It should be appreciated that the surface layer 140C may be omitted, when the corresponding second layer 140 may generally have a reduced tendency for creating resist residuals during the formation of the resist mask 136. In respective process strategies, however, in which, in particular, a highly compressive silicon nitride layer may be formed as the second layer 140, the surface layer 140C may be highly advantageous for reducing resist poisoning effects. Next, a corresponding etch process 137 may be performed on the basis of the resist mask 136, thereby removing the exposed portion of the second layer 140C above the first transistor 110, wherein the etch indicator layer 132 may be efficiently used for detecting an appropriate endpoint of the etch process 137. In other cases, when the etch indicator layer 132 may not be provided, a corresponding stop or endpoint detection signal may be generated on the basis of the surface layer 130C, which may be comprised of silicon dioxide, as previously explained. Consequently, the corresponding stress-inducing layers 130, 140 may be efficiently patterned on the basis of the resist mask 133A and 136 with a significantly reduced probability of creating respective resist residuals and, thus, nitrogen residuals compared to conventional strategies.

Figure 1F:
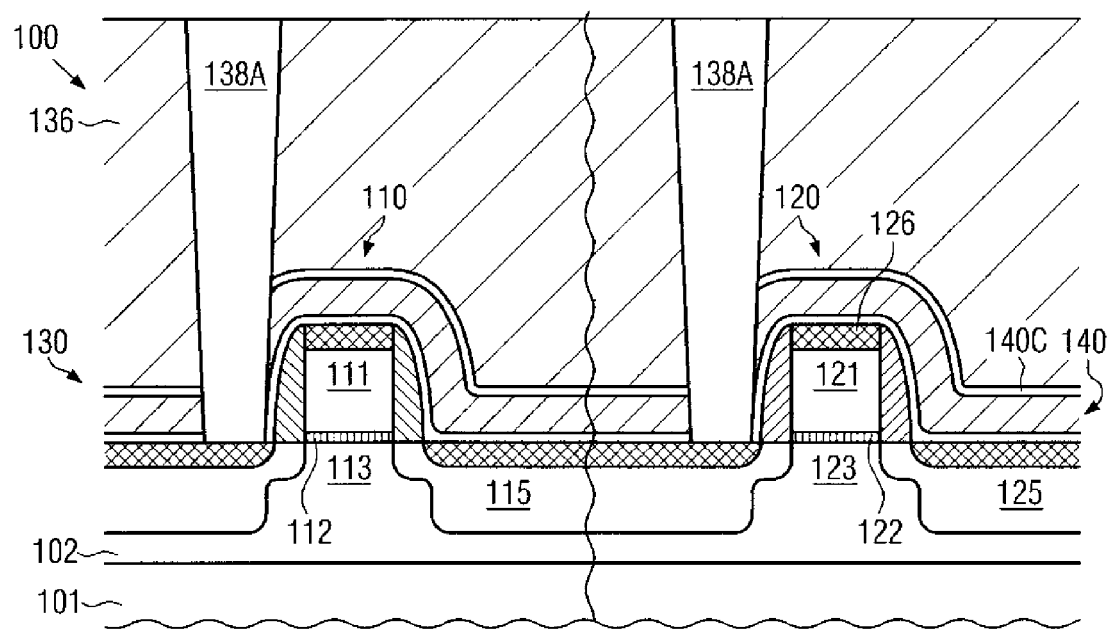
FIG. 1f schematically illustrates a cross-sectional view of the semiconductor device according to a further illustrative embodiment, in which an in situ plasma treatment and etch indicator deposition may be performed.

FIG. 1f schematically illustrates the semiconductor device 100 in a further advanced manufacturing stage. An interlayer dielectric material 138 may be formed above the first and the second transistor elements 110, 120 so as to reliably encapsulate these devices and provide a substantially planar surface topography. The interlayer dielectric material 138 may be comprised of any appropriate material, such as silicon dioxide having appropriate characteristics for appropriately passivating the circuit elements 110, 120. Furthermore, respective contact openings 138A may be formed through the interlayer dielectric material 138 and the corresponding stress-inducing layers 130, 140 in order to connect to respective contact areas, such as the metal silicide regions 116, 126, respectively.

The device 100 as shown in FIG. 1f may be formed on the basis of the following processes. After removing the resist mask 136 (FIG. 1e) on the basis of well-established techniques, the interlayer dielectric material 138 may be deposited on the basis of appropriate techniques, such as high density plasma CVD, sub-atmospheric CVD and the like, in which, based on TEOS, a corresponding silicon dioxide material may be deposited. Thereafter, optional planarization steps may be performed in order to increase the surface planarity, if required, and thereafter a corresponding lithography process may be performed to provide an appropriate resist mask (not shown) for defining the respective openings 138A. Thereafter, a corresponding anisotropic etch process may be performed on the basis of well-established techniques, wherein the silicon nitride material of the first and the second layers 130, 140 may act as an efficient etch stop material, when the respective openings 138A may have to be formed to very different depths, for instance when a respective contact opening also has to be formed to the respective gate electrodes 111, 121 in a common etch process. Thereafter, a dedicated etch step may be performed to etch through the layers 130, 140, wherein, due to a substantially uniform thickness of the corresponding layers due to the significantly reduced probability for creating corresponding silicon nitride residuals during the patterning sequences based on the resist masks 133A, 136, the corresponding openings 138A may be provided with high uniformity and reliability. During the corresponding etch process for etching through the layers 130, 140, the etch stop layer 130A may be used for controlling the respective etch process. Thereafter, the respective openings 138A may be filled with any appropriate material, such as tungsten, tungsten silicide and the like.

Consequently, by performing at least one plasma treatment, such as the treatments 131 and 135, the reliability of the corresponding patterning process for forming the openings 138A may be significantly enhanced. It should be appreciated that, depending on the respective patterning sequence for providing the layers 130, 140, a corresponding one of the treatments 131, 135 may be performed in combination with a corresponding layer 130, 140 having a high content of nitrogen in order to at least reduce the resist poisoning probability for this layer. In other embodiments, both treatments 131, 135 may be performed in order to even further enhance the reliability of the patterning process for the openings 138A.

Figure 1G:
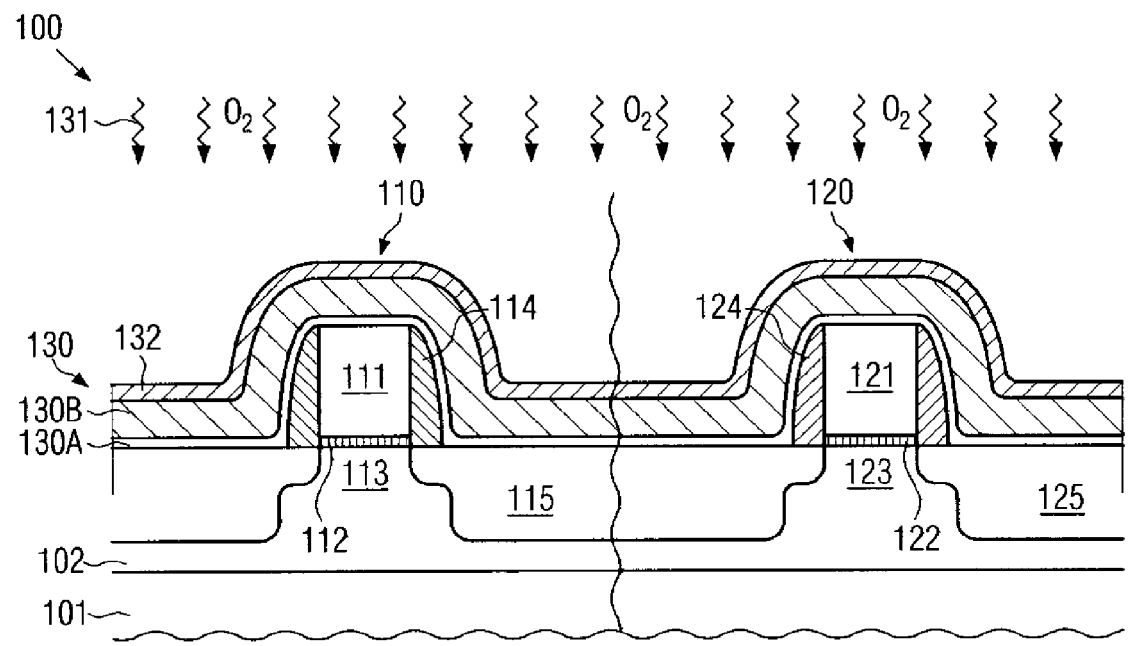
FIG. 1g schematically illustrates a cross-sectional view of the semiconductor device according to still further illustrative embodiments, in which a final silicon nitride material may be formed above an etch indicator layer prior to performing a plasma treatment.

FIG. 1g schematically illustrates the semiconductor device 100 according to still other illustrative embodiments, in which the first stressed layer 130, which may comprise the etch stop layer 130A, may be formed in accordance with process recipes, as previously explained. Furthermore, the etch indicator layer 132 may be formed on the nitrogen-containing layer portion similarly to the silicon nitride layer 130B, as previously described, on the basis of any appropriate deposition recipe. For example, in one illustrative embodiment, the etch indicator layer 132 may be formed on the basis of silane in an in situ process, wherein the layers 130B and the etch indicator layer 132 may be formed in the same process tool. Thereafter, the plasma treatment 131 may be performed in an oxidizing ambient, as previously explained, in order to modify the surface characteristics of the layer 132 for providing enhanced diffusion blocking characteristics. In this way, the overall efficiency of the process sequence may be improved, since the layers 130B and 132 may be formed in a highly efficient manner, without requiring intermediate transport activities for the device 100, while subsequently the plasma treatment 131 may be performed in a respective dedicated process tool. Thereafter, the further processing may be continued as is previously described with reference to FIGS. 1b and 1c. That is, a respective resist material may be deposited, wherein the enhanced surface characteristics of the layer 132 may provide a significantly reduced degree of resist poisoning, as is also previously described.

Figure 1H:
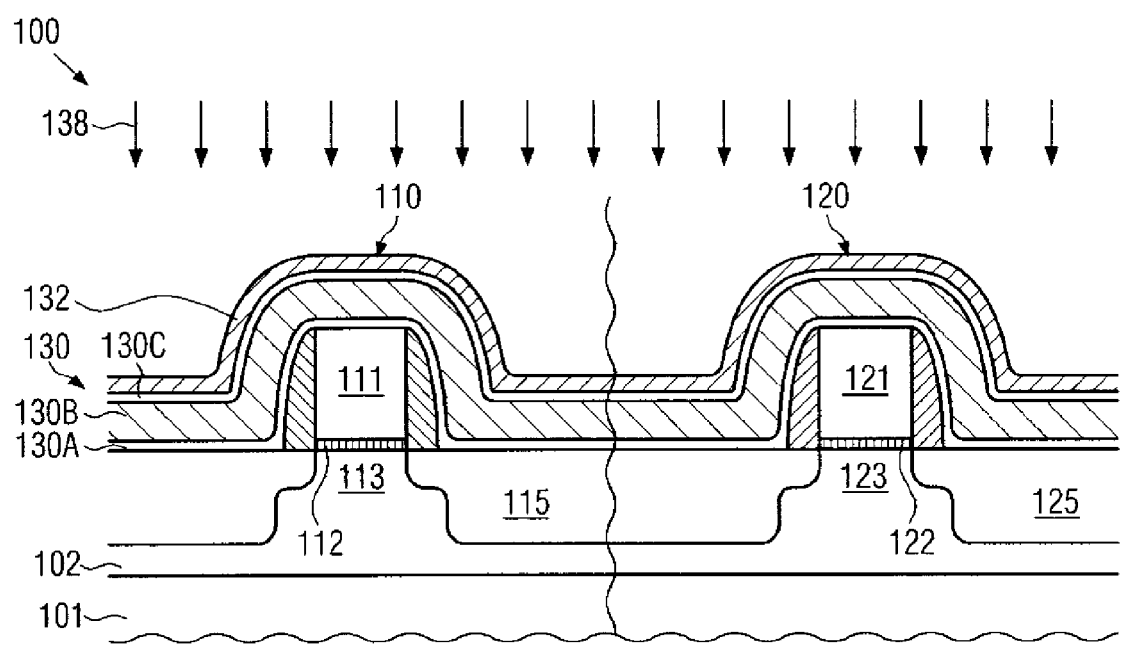
FIGS. 1h-1i schematically illustrate cross-sectional views of the semiconductor device according to still further illustrative embodiments.

FIG. 1h schematically illustrates a semiconductor device 100 according to yet another illustrative embodiment, in which the stress-inducing layer 130, i.e., the silicon nitride containing portion 130B, may be subjected to the plasma treatment 131 in an oxidizing ambient, as previously explained, so as to form the highly efficient surface layer 130C, wherein the corresponding plasma ambient of the process 131 may be established in the deposition tool used for forming the silicon nitride material of the layer 130B. For this purpose, the supply of respective precursor gases, such as silane and ammonium, may be stopped and oxygen and/or ozone may be supplied into the deposition chamber in order to form the surface layer 130C. Thereafter, a further deposition step 138 may be performed within the same deposition tool to form the etch indicator layer 132, for instance on the basis of silane, in order to provide the desired endpoint detection signal during the patterning of the layer 130, as previously described. Consequently, forming the surface layer 130C directly on the silicon nitride containing layer 130B may provide a highly dense and efficient diffusion blocking layer, wherein the overall process sequence may be performed in a highly efficient manner due to the in situ nature of the entire process sequence for forming the layers 130B, 130C and 132. Thus, compared to the strategy in FIG. 1g, an even more enhanced effect in reducing resist poisoning may be achieved, which is believed, based on corresponding measurement results, to reside in the fact that the silicon nitride layer 130B may have a more uniform surface configuration, which may then be sealed in a more efficient manner compared to the less uniform surface configuration of the silane-based etch indicator layer 132.

Figure 1I:
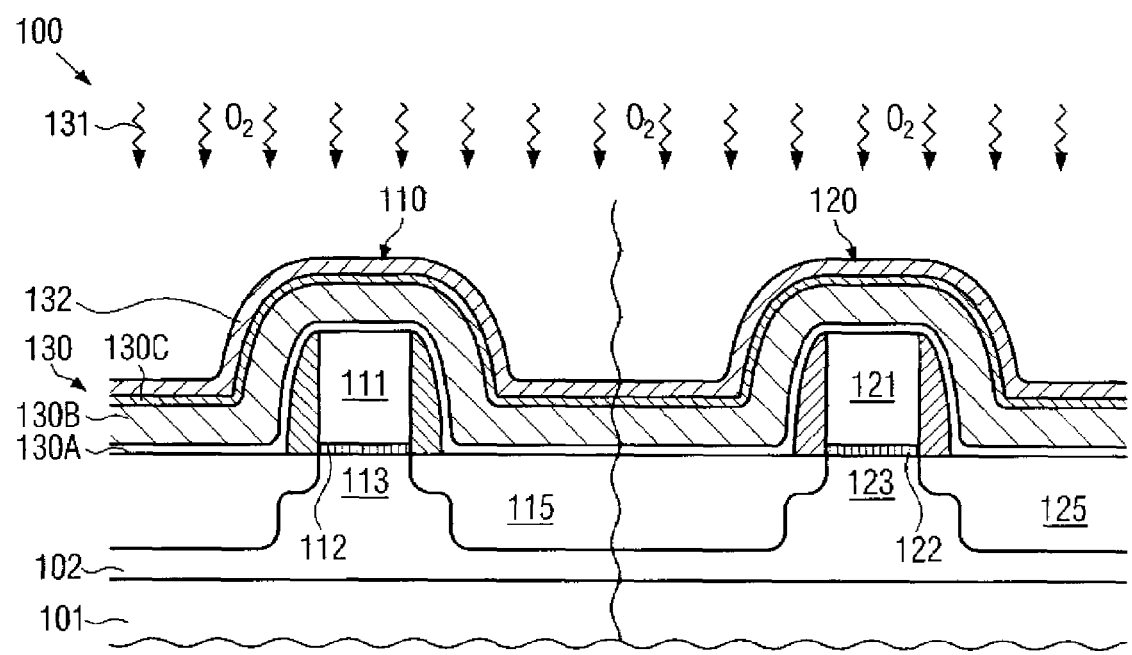

FIG. 1i schematically illustrates the semiconductor device 100 in accordance with further illustrative embodiments, in which the layer 130 may be provided as a stack of layers including the silicon nitride layer 130B, the etch indicator layer 132 and the surface layer 130C, which may be provided in the form of a silicon nitride layer. Furthermore, as previously explained, the optional etch stop layer 130A may also be provided. The layers 130B, 132 and 130C may be formed in the same deposition tool, that is, first the silicon nitride layer 130B may be formed on the basis of respective process parameters so as to obtain the desired intrinsic stress, followed by the deposition of an etch indicator material, such as silane-based silicon dioxide, to form the etch indicator layer 132, wherein subsequently a further silicon nitride material 130C may be formed with an appropriate thickness, for instance, approximately 5-10 nm, in order to provide the desired surface characteristics for the subsequent plasma treatment 131. Hence, due to the highly efficient modification of the surface layer 130C, when comprised of silicon nitride, a desired high degree of nitrogen diffusion blocking effect may be obtained, while nevertheless a highly efficient process flow for forming the layers 130B, 132 and 130C may be accomplished. Hence, the stressed layer 130, possibly except for the etch stop layer 130A, may be formed within a single deposition tool without requiring additional transport activities, while the plasma treatment 131 may be performed in any dedicated process tool, while nevertheless providing for the surface layer 130C on the basis of silicon nitride having the desired enhanced diffusion blocking characteristics. Thereafter, the further processing may be continued as is previously described.

It should be appreciated that the subject matter disclosed herein is highly advantageous in the context of patterning respective stressed silicon nitride layers for obtaining different types of strain in the respective transistors 110, 120, wherein the one or more plasma treatments 131, 135 provide the high degree of process flexibility while also maintaining a degree of resist poisoning at a very low level, thereby enhancing the reliability of the corresponding patterning process for forming the openings 138A. The principles disclosed herein may also be applied to other situations, in which a sensitive resist material may have to be provided above a nitrogen-containing material layer. For example, nitrogen-containing materials, such as silicon nitride, silicon oxynitride and the like, may be frequently used as ARC materials for adjusting optical characteristics during sophisticated lithography processes. Due to resist poisoning, usually a respective cap layer needs to be provided above the corresponding nitrogen-containing ARC material, wherein the corresponding cap layer may have a significant influence on the overall performance of the resulting ARC layer stack. For example, silicon dioxide is frequently used as a cap layer, wherein a thickness of up to 10 nm may be required for efficiently blocking a nitrogen contamination of an overlying sensitive resist material. Consequently, the subject matter disclosed herein may also be applied to provide an efficient cap layer for a nitrogen-based ARC material.

Similarly, in sophisticated integrated circuits, typically low-k dielectric materials may be used in the metallization level of an integrated circuit, while nitrogen-containing etch stop layers may be used for confining highly conductive metals, such as copper, copper alloys and the like, and may also be used for controlling a respective etch process for patterning corresponding low-k dielectric materials. Since low-k materials, which may be understood as materials having a relative permittivity of 3.0 and significantly less, frequently have a porous structure, nitrogen may readily diffuse within the low-k dielectric material and may finally reach respective exposed surface areas, such as via openings, trenches, that are already formed in the low-k dielectric material, which may then diffuse into respective resist materials, thereby causing a significant resist poisoning. Thus, although a respective resist material may be applied on a corresponding low-k dielectric layer stack, nevertheless nitrogen of an underlying etch stop layer may readily diffuse into the resist materials. Also, in this case, the subject matter disclosed herein may be advantageously applied in order to provide a high degree of process flexibility in reducing an undue nitrogen diffusion, while maintaining a high degree of compatibility with conventional process techniques. As an exemplary embodiment for applying the principles disclosed herein in applications other than patterning respective stressed dielectric layers, as is previously described with reference to FIGS. 1a-1i, a corresponding process will be described in which a nitrogen-containing ARC layer is used to pattern an interlayer dielectric material for forming respective contact openings of a transistor element.

Figure 2A:
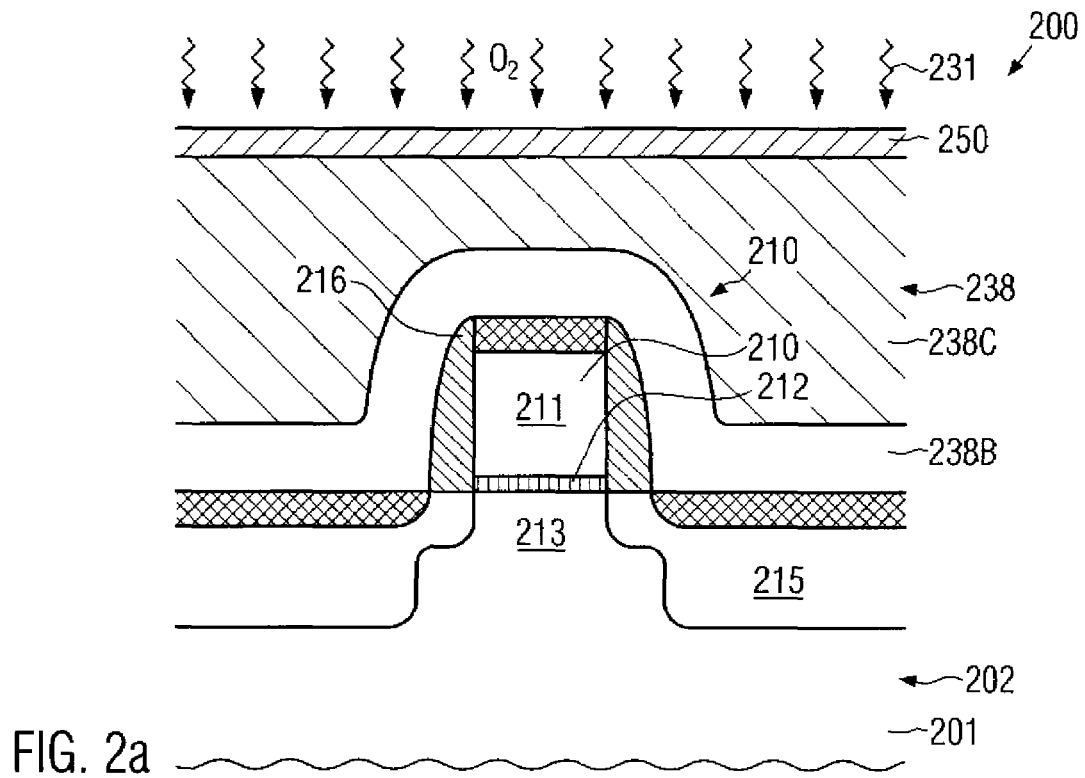
FIGS. 2a-2c schematically illustrate cross-sectional views of a semiconductor device during various manufacturing stages in patterning a dielectric layer on the basis of a silicon nitride containing ARC material receiving a plasma treatment according to still further illustrative embodiments disclosed herein.

FIG. 2a schematically illustrates a semiconductor device 200 in a cross-sectional view, which may comprise a field effect transistor 210 in an advanced manufacturing stage. The device 200 may comprise a substrate 201 having formed thereabove a respective semiconductor layer 202, wherein the same criteria apply as previously explained with reference to the device 100. The transistor 210, which may, for instance, represent one of the transistors 110, 120 as previously described, may comprise a gate electrode 211, a gate insulation layer 212, a channel region 213, drain and source regions 215, a spacer structure 214 and respective metal silicide regions 216. Furthermore, the transistor 210 may be embedded in an interlayer dielectric material 238, which may comprise a first layer 238C, which may, for instance, be comprised of silicon dioxide and the like, while a second portion 238B may represent an etch stop material, a stressed material and the like, as required by design rules. In some illustrative embodiments, the layer 238B may substantially correspond to one of the stressed layers 130, 140, as previously described. Furthermore, the interlayer dielectric material 238 may have formed thereon an ARC material 250 comprising nitrogen, for instance in the form of silicon oxynitride, having a specified material composition and thickness in order to reduce any back reflection for a specified exposure wavelength used in a subsequent photolithography process.

The device 200 as shown in FIG. 2a may be formed in accordance with process techniques as are previously described with reference to the device 100. Moreover, after forming the interlayer dielectric material 238, the ARC material 250 may be deposited on the basis of well-established techniques, such as PECVD and the like, in which the corresponding deposition parameters may be controlled to obtain the desired thickness and material composition. Thereafter, the layer 250 may be exposed to a plasma ambient 231 in an oxidizing atmosphere containing oxygen or ozone in order to densify the surface of the material 250, as was previously explained with reference to the device 100. Thus, by performing the plasma treatment 231 on the basis of the nitrogen-containing ARC material 250, a thin surface layer may be formed, which may reliably reduce any nitrogen diffusion, when a respective sensitive photoresist material may be deposited onto the layer 250 in a subsequent process step. Thus, a corresponding thickness of the resulting surface layer having the enhanced diffusion blocking characteristics may be in the range of several nanometers, thereby providing enhanced process efficiency during the subsequent patterning process substantially without negatively affecting the optical characteristics of the ARC material 250.

Figure 2B:
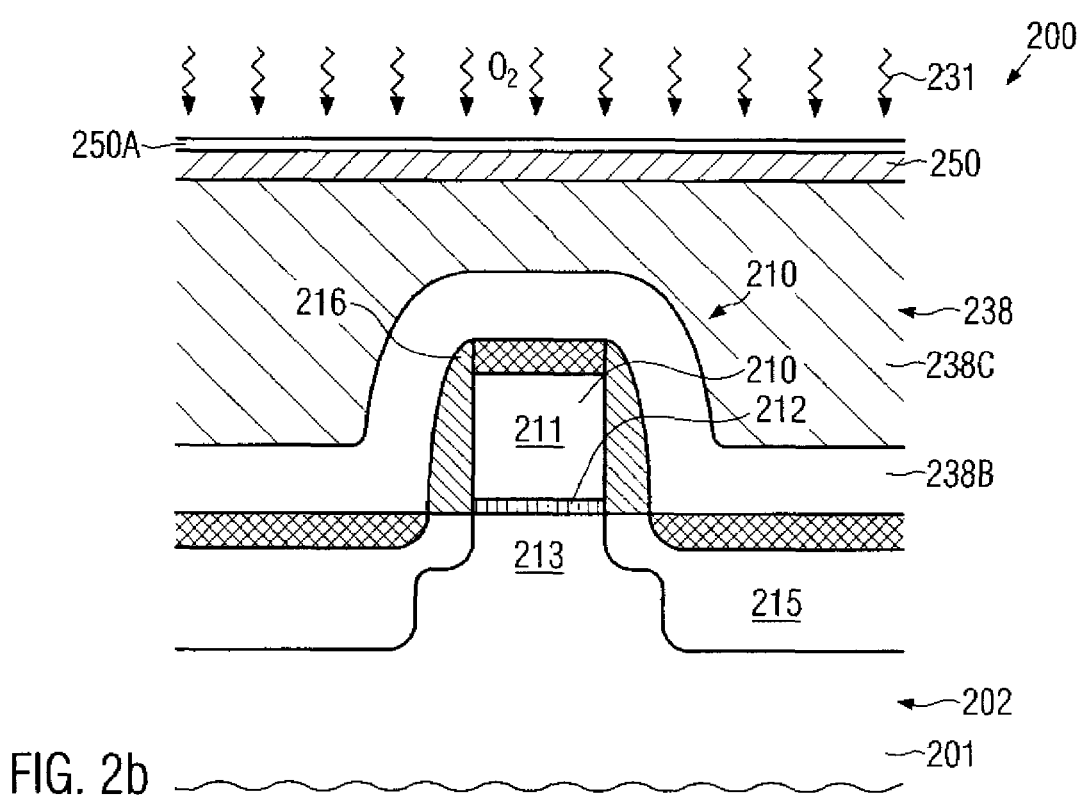

FIG. 2b schematically illustrates the semiconductor device 200 according to a further illustrative embodiment, in which the ARC material 250 may receive a cap layer, which may be comprised of silicon nitride, to provide respective surface characteristics in order to even further enhance the efficiency of the corresponding plasma treatment 231 as is previously explained with reference to the device 100. For example, the ARC material 250 may be provided as a silicon oxynitride material, which may be deposited on the basis of well-established recipes, followed by the deposition of a silicon nitride material, which may have a thickness of approximately 10 nm and significantly less. Thereafter, the plasma treatment 231 may be performed in order to efficiently modify the surface thereof to create a capping layer 250A as a diffusion blocking layer in order to reduce any resist poisoning effects during the further processing.

Figure 2C:
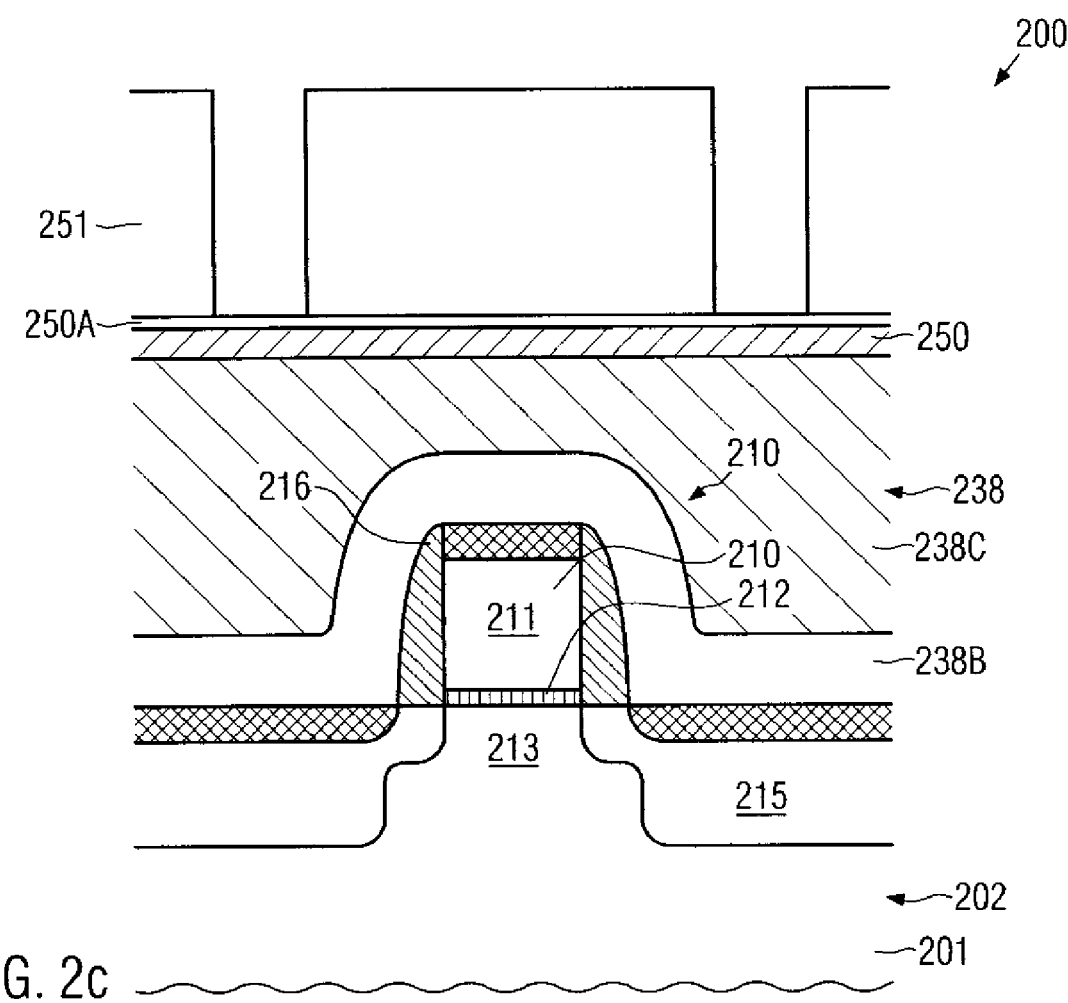

FIG. 2c schematically illustrates the semiconductor device 200 in a further advanced manufacturing stage, in which a corresponding resist mask 251 may be formed above the ARC material 250, which may comprise the modified capping layer 250A, if provided. Thereafter, the interlayer dielectric material 238 may be efficiently patterned on the basis of the resist layer 251, wherein the plasma treated ARC material 250 may provide increased process flexibility with respect to forming the ARC material 250.

It should be appreciated that the transistor 210 may have formed thereabove the layer 230 in a highly stressed condition, wherein a corresponding patterning process may have been performed for providing a different type of stressed layer above the different device regions, wherein also respective process techniques may have been used as previously described with reference to the device 100.

As a result, the subject matter disclosed herein provides a technique for efficiently confining nitrogen in a silicon nitride containing material layer by performing a plasma treatment in an oxidizing ambient, thereby efficiently sealing the respective surface portion. Consequently, silicon nitride containing layers, such as stressed dielectric materials provided above respective transistor elements, may be effectively patterned with a significantly reduced probability for respective defects caused by resist poisoning, while nevertheless maintaining a high degree of compatibility with conventional process techniques. In other cases, enhanced process flexibility in combination with a highly efficient reduction of resist poisoning may be provided, for instance with respect to ARC materials, etch stop/barrier layers and the like, by performing a respective plasma treatment.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first stress-inducing layer above a first transistor and a second transistor, wherein forming said first stress-inducing layer comprises depositing a stressed material layer and forming an etch indicator layer thereon;
    performing a plasma treatment on said first stress-inducing layer for densifying a surface thereof;
    forming a first resist mask above said first stress-inducing layer having said densified surface to cover said first transistor, said first resist mask exposing a portion of said first stress-inducing layer; and
    removing said exposed portion of said first stress-inducing layer from above said second transistor.

2. The method of claim 1, wherein said plasma treatment is performed in an oxidizing ambient.

3. The method of claim 1, wherein performing said plasma treatment and forming said first stress-inducing layer are performed in situ.

4. The method of claim 1, wherein said first stress-inducing layer comprises intrinsic compressive stress.

5. The method of claim 1, further comprising forming an etch stop layer on said first and second transistors prior to forming said first stress-inducing layer.

6. The method of claim 1, wherein said stressed material layer comprises silicon nitride.

7. The method of claim 6, wherein forming said first stress-inducing layer further comprises forming a cap layer on said etch indicator layer, said cap layer comprising silicon nitride.

8. The method of claim 1, further comprising forming a second stress-inducing layer above said first and second transistors and selectively removing said second stress-inducing layer from said first transistor on the basis of a second resist mask.

9. The method of claim 8, further comprising performing a plasma treatment for sealing a surface of said second stress-inducing layer prior to forming said second resist mask.

10. A method, comprising:
    forming a silicon nitride containing material layer above a device area of a semiconductor device;
    forming an etch indicator layer on said silicon nitride containing material layer;
    performing a plasma treatment in an oxidizing ambient to modify a surface of said silicon nitride containing material layer;
    forming a resist mask above said plasma treated silicon nitride containing material layer; and
    performing an etch process on the basis of said resist mask.

11. The method of claim 10, wherein said silicon nitride containing material layer is a stress-inducing dielectric layer located above a transistor device.

12. The method of claim 10, wherein said silicon nitride containing material layer is used as an anti-reflective layer for forming said resist mask.

13. The method of claim 10, wherein forming said silicon nitride containing material layer comprises forming a silicon dioxide material as a cap layer of said silicon nitride containing material layer.

14. The method of claim 10, further comprising forming a cap layer on said silicon nitride containing material layer after performing said plasma treatment.

15. The method of claim 10, wherein forming said silicon nitride containing material layer comprises depositing a first silicon nitride material, depositing a silicon dioxide material on said silicon nitride and depositing a second silicon nitride material on said silicon dioxide material.

16. The method of claim 10, further comprising forming an etch stop layer on said device area of said semiconductor device prior to forming said silicon nitride containing material layer.

17. The method of claim 10, further comprising forming a dielectric material layer on said silicon nitride containing material layer and patterning said dielectric layer using said silicon nitride containing material layer as an etch stop layer.

18. The method of claim 17, wherein said dielectric layer comprises a low-k dielectric material.

19. A method, comprising:
forming a first stress-inducing layer having a first type of intrinsic stress above a first device region and a second device region, wherein forming said first stress-inducing layer comprises forming an etch indicator layer;
forming a first resist mask above said first stress-inducing layer, said first resist mask exposing said second device region and covering said first device region;
selectively removing said first stress-inducing layer from above said second device region;
forming a second stress-inducing layer having a second type of intrinsic stress above said first and second device regions;
forming a second resist mask above said second stress-inducing layer, said second resist mask exposing said first device region and covering said second device region; and
performing at least one plasma treatment at least prior to forming said second resist mask.

20. The method of claim 19, wherein forming said first stress-inducing layer further comprises forming a silicon nitride containing material layer and forming a cap on said silicon nitride containing material layer.

21. The method of claim 19, wherein forming said first stress-inducing layer comprises forming a first silicon nitride layer, forming said etch indicator layer thereon, said etch indicator layer having a different material composition compared to said first silicon nitride layer, and forming a second silicon nitride layer on said etch indicator layer.

22. The method of claim 19, further comprising forming an etch stop layer on said first and second device regions prior to forming said first stress-inducing layer.

* * * * *